United States Patent
Li et al.

(10) Patent No.: US 9,024,299 B2
(45) Date of Patent: May 5, 2015

(54) METHOD FOR FABRICATING A DUAL WORK FUNCTION SEMICONDUCTOR DEVICE AND THE DEVICE MADE THEREOF

(75) Inventors: Zilan Li, Heverlee (BE); Joshua Tseng, Tervuren (BE); Thomas Witters, Hasselt (BE); Stefan De Gendt, Wijnegem (BE)

(73) Assignees: IMEC, Leuven (BE); Taiwan Semiconductor Manufacturing Company, Ltd., Hsinchu (TW); Katholieke Universiteit Leuven, Leuven (BE)

(*) Notice: Subject to any disclaimer, the term of this patent is extended or adjusted under 35 U.S.C. 154(b) by 548 days.

(21) Appl. No.: 12/578,439

(22) Filed: Oct. 13, 2009

(65) Prior Publication Data
US 2010/0109095 A1 May 6, 2010

Related U.S. Application Data

(60) Provisional application No. 61/105,368, filed on Oct. 14, 2008.

(30) Foreign Application Priority Data

Feb. 25, 2009 (EP) .................................... 09075085

(51) Int. Cl.
 *H01L 21/8234* (2006.01)
 *H01L 21/8238* (2006.01)
 (Continued)

(52) U.S. Cl.
 CPC .. *H01L 21/823842* (2013.01); *H01L 21/28229* (2013.01); *H01L 21/823857* (2013.01);
 (Continued)

(58) Field of Classification Search
 CPC .............. H01L 21/823842; H01L 21/82385; H01L 21/28229; H01L 29/66545

USPC ................... 257/402, 407, E21.635, E21.637
See application file for complete search history.

(56) References Cited

U.S. PATENT DOCUMENTS 6,458,695 B1  10/2002  Lin et al.
8,536,660 B2 *  9/2013  Hsu et al. ...................... 257/410
(Continued)

FOREIGN PATENT DOCUMENTS

WO   WO 2006/021907 A1   3/2006
WO   WO 2008/072203 A1   6/2008

OTHER PUBLICATIONS

Zhang, et al., Integration of Dual Metal Gate CMOS with TaSiN (NMOS) and Ru (PMOS) Gate Electrodes on HfO2 Gate Dielectric, 2005 Symposium on VLSI Technology Digest of Technical Papers, Jun. 14-15, 2005, pp. 50-51.

(Continued)

*Primary Examiner* — Laura Menz
*Assistant Examiner* — Candice Y Chan
(74) *Attorney, Agent, or Firm* — Knobbe, Martens, Olson & Bear LLP (57) ABSTRACT

A method for manufacturing a dual work function semiconductor device and the device made thereof are disclosed. In one aspect, a method includes providing a gate dielectric layer over a semiconductor substrate. The method further includes forming a metal layer over the gate dielectric layer. The method further includes forming a layer of gate filling material over the metal layer. The method further includes patterning the gate dielectric layer, the metal layer and the gate filling layer to form a first and a second gate stack. The method further includes removing the gate filling material only from the second gate stack thereby exposing the underlying metal layer. The method further includes converting the exposed metal layer into an metal oxide layer. The method further includes reforming the second gate stack with another gate filling material.

11 Claims, 8 Drawing Sheets

(51) Int. Cl.
*H01L 21/28* (2006.01)
*H01L 29/66* (2006.01)
*H01L 29/49* (2006.01)
*H01L 29/51* (2006.01)
*H01L 29/78* (2006.01)

(52) U.S. Cl.
CPC ........... *H01L29/4966* (2013.01); *H01L 29/517* (2013.01); *H01L 29/66545* (2013.01); *H01L 29/785* (2013.01)

(56) References Cited

U.S. PATENT DOCUMENTS

2004/0106249 A1  6/2004  Huotari
2004/0106261 A1  6/2004  Huotari et al.
2007/0037335 A1* 2/2007  Chambers et al. ............ 438/197
2008/0173947 A1  7/2008  Hou et al.

OTHER PUBLICATIONS

European Search Report dated Feb. 8, 2010 for EP Application No. 09075085.2.

* cited by examiner

METHOD FOR FABRICATING A DUAL WORK FUNCTION SEMICONDUCTOR DEVICE AND THE DEVICE MADE THEREOF

CROSS REFERENCE TO RELATED APPLICATIONS

This application claims priority under 35 U.S.C. §119(e) to U.S. provisional patent application 61/105,368 filed on Oct. 14, 2008, which application is hereby incorporated by reference in its entirety.

BACKGROUND OF THE INVENTION

1. Field of the Invention

The present invention generally relates to methods for manufacturing semiconductor devices. More particularly, this invention relates to methods for manufacturing CMOS devices comprising a gate stack, the gate stack comprising a metal gate electrode featuring dual work function and the CMOS devices made thereof.

2. Description of the Related Technology

Up to now, semiconductor industry remains driven by scaling geometric dimensions of metal-oxide-semiconductor field-effect-transistors (MOSFETs). With traditional MOSFET-technology, using silicon dioxide ($SiO_2$) as gate dielectric and polycrystalline silicon (poly-Si) as gate electrode, a lot of problems occur when scaling down to 100 nm or below.

As the gate dielectric thickness is reduced, an exponential increase of gate direct tunnelling currents occurs. One solution to solve this problem is the introduction of so-called high-k dielectrics as gate dielectric. A high-k dielectric is a dielectric featuring a dielectric constant (k) higher than the dielectric constant of $SiO_2$, i.e. k>3.9. High-k dielectrics allow for a larger physical thickness (compared to $SiO_2$) for obtaining a same effective capacitance than can be obtained with a much thinner $SiO_2$ layer. The larger physical thickness of the high-k material will reduce gate leakage currents.

With the introduction of the high-k materials a new problem arose, namely the Fermi level pinning effect, originating in the interaction between high-k material and polysilicon. Fermi level pinning is a fundamental characteristic of the polysilicon/metal oxide interface that causes high threshold voltages in MOSFET devices. A solution to this problem is the introduction of metals as gate electrode.

By introducing metal gates, the threshold voltage of the MOSFET becomes controlled by the metal work function. Regarding metal gate electrodes, tuning of the effective work function is not straightforward as a different effective work function is needed for NMOS than for PMOS. This requires now a (n-type) metal (replacing poly-Si) that works for nMOSFET (i.e. an effective work function preferably between about 3.9 eV and about 4.5 eV) and a (p-type) metal that works for pMOSFET (i.e. an effective work function preferably between about 4.7 eV and about 5.3 eV). Whereas the work function of polysilicon can be tuned by ion implantation, the work function of a metal is a material property which cannot be changed easily.

A possible solution is the use of two metallic materials with different work functions in order to achieve the right threshold voltages for both NMOS and PMOS, also often referred to a dual work function CMOS device. A possible integration scheme is described in an article of Z. Zhang et. al. in "Integration of dual metal gate CMOS with TaSiN (NMOS) and Ru (PMOS) gate electrodes on HfO2 gate dielectric" published in *VLSI Tech. Digest*, pp. 50-51, 2005. In this integration scheme a first metal layer is deposited on the gate dielectric layer. After partly removing the first metal layer from either NMOS or PMOS side, a second metal layer with a different work function compared to the first metal layer is formed on top of the exposed gate dielectric layer and the remaining first metal layer. Unfortunately, this involves exposing the gate (high-k) dielectric layer to an etchant, leading to dielectric thinning and reliability problems. This integration strategy also requires several patterning, etch and gate stack deposition processes.

The introduction of new gate materials, such as high-k gate dielectrics combined with metal gate electrodes, is not simple, since problems may occur in the traditional gate-first fabrication process steps like etch and strip. Hence, for the integration of high-k gate dielectrics and metal gate electrodes in a complementary metal-oxide-semiconductor (CMOS) device, new manufacturing-friendly alternatives have to be introduced in the process flow. Although already some possibilities are available in the state-of-the-art for the integration of metal gate and high-k dielectric in CMOS devices, there is a need for simplified integration schemes for high-k/metal semiconductor device.

SUMMARY OF CERTAIN INVENTIVE ASPECTS

Certain inventive aspects relate to a method for manufacturing a dual work function semiconductor device and to a dual work function semiconductor device.

One inventive aspect relates to a method for manufacturing a dual work function semiconductor device. The method comprises providing a semiconductor substrate 100; providing a gate dielectric layer 104 on and in contact with the semiconductor substrate 100; forming a metal layer 105 having a thickness on and in contact with the gate dielectric layer 104; forming a layer of gate filling material 106 on and in contact with the metal layer 105; patterning the gate dielectric layer 104, the metal layer 105 and the gate filling layer 106 to form a first gate stack 111 and a second gate stack 112; selectively removing the gate filling material 106 only from the second gate stack 112 thereby exposing the underlying metal layer 105 and converting the exposed metal layer 105 into an metal oxide layer 1051.

An annealing process is performed after the process of forming the first and the second gate stack at least prior to the process of converting the exposed metal layer 105 into a metal oxide layer, thereby forming in the semiconductor substrate 100 activated source and drain regions 109 for both the first gate stack 111 and the second gate stack 112. Preferably this annealing process is performed prior to the process of selectively removing the gate filing material 106.

The annealing process thereby forming in the semiconductor substrate 100 source and drain regions 109 for both the first gate stack 111 and the second gate stack 112 occurs before the process of removing the gate filling material 106.

According to embodiments of the present invention the method further comprises reforming the second gate stack with another gate filling material 115.

The process of selectively removing the gate filling material 106 comprises forming a dielectric layer 114 in the first 101 and the second 102 region at least next to the first 111 and the second gate stack 112.

Forming a dielectric layer 114 in the first and the second region at least next to the first and the second gate stack further comprises also forming the dielectric layer on top of the first gate stack.

The thickness and the material of the metal layer is selected to achieve an effective work function selected for the first gate stack. After converting the exposed metal layer into a metal oxide layer, the metal oxide layer and its thickness determine another effective work function selected for the second gate stack.

The effective work function selected for the first gate stack is lower than the another effective work function selected for the second gate stack. The effective work function of the first gate stack is determined by the metal layer 105 and the effective work function of the second gate stack is determined by the metal oxide layer 1051.

The thickness of the metal layer 105 is preferably in the range of 0.5 nanometers and 5 nanometers.

The metal layer preferably comprises an oxygen-deficient metal. The metal layer may comprise a metal selected from TiN, TaN, TaC, TiC, Ti, Mo, Ru or W.

According to embodiments of the first aspect a protective layer may be formed on and in contact with the gate filling layer in the second region before patterning the first and the second gate stack. The protective layer may be patterned during the process of patterning the gate dielectric layer, the metal layer and the gate filling layer to form the first gate stack and the second gate stack.

According to embodiments of the first aspect removing the gate filling material from the second gate stack thereby exposing the underlying metal layer comprises removing the protective layer and the gate filling material from the second gate stack.

The effective oxide thickness of the gate dielectric layer of the first gate stack before and after oxidizing the exposed metal layer of the second gate stack remains unchanged. The effective oxide thickness of the gate dielectric layer of the second gate stack after oxidizing the exposed metal layer remains unchanged.

According to certain embodiments of the first aspect reforming the second gate stack with another gate filling material is done after the process of converting the exposed metal layer into a metal oxide layer. The another gate filling material preferably comprises a metal. The metal may be selected from TiN, TaN, TaC, TiC, Ti, Mo, Ru and W.

Converting the exposed metal layer into a metal oxide layer may comprise annealing the metal layer. The temperature of annealing is preferably in the range of 20 degrees Celsius to 500 degrees Celsius, more preferably in the range of 200 degrees Celsius to 400 degrees Celsius. The time of annealing is preferably longer than 1 second, more preferably in a range of 10 seconds to 1200 seconds (20 minutes).

Converting the exposed metal layer into a metal oxide layer may comprise an implantation process of oxygen.

The metal layer must be completely oxidized. The metal layer must be completely converted into a metal oxide layer.

According to another embodiment of the first aspect reforming the second gate stack with another gate filling material is done before the process of converting the exposed metal layer into a metal oxide layer. The another gate filling material preferably comprises an oxygen-rich metal. The oxygen-rich metal may be selected from $RuO_x$ or $MoO_x$ or $WO_x$. Converting the exposed metal layer into a metal oxide layer comprises supplying oxygen from the another gate filling material into the exposed metal layer. Supplying oxygen preferable comprises a thermal treatment.

The gate filling material preferably comprises a semiconductor. The semiconductor may be selected from Si or SiGe.

According to an embodiment of the present invention the metal layer preferably comprises any of TiN, TaN, TaC, TiC, Ti, Mo, Ru or W; the metal oxide layer respectively comprises $TiO_xN_y$, $TaO_xN_y$, $TaO_xC_y$, $TiO_xC_y$, $TiO_x$, $MoO_x$, $RuO_x$ or $WO_x$ and the gate filling material comprises Si or SiGe. The another gate filling material may comprise any of $RuO_x$, or $WO_x$ or $MoO_x$ or may comprise any of TiN, TaN, TaC, TiC, Ti, Mo, Ru and W.

A second inventive aspect relates to a dual work function semiconductor device comprising a semiconductor substrate; a first gate stack and a second gate stack on the semiconductor substrate. The first gate stack comprises a first gate dielectric layer on and in contact with the semiconductor substrate; a metal layer on and in contact with the first gate dielectric layer; a gate filling material on and in contact with the metal layer. The second gate stack comprises a second gate dielectric layer on and in contact with the semiconductor substrate, the second gate dielectric layer consisting of the same material as the first gate dielectric layer; a metal oxide layer on and in contact with the first gate dielectric layer; the metal oxide layer comprising a metal oxide formed by converting a metal into the metal oxide, the metal being the same as the metal from the metal layer in the first gate stack; another gate filling material on and in contact with the metal oxide layer, the another gate filling material comprising another material than the gate filling material from the first gate stack.

The metal layer of the dual work function semiconductor device according to the second aspect of the present invention preferably comprises an oxygen-deficient metal, more preferably TiN, TaN, TaC, TiC, Ti, Mo, Ru or W. The metal oxide layer formed by converting the metal into the metal oxide layer respectively comprises $TiO_xN_y$, $TaO_xN_y$, $TaO_xC_y$, $TiO_xC_y$, $TiO_x$, $MoO_x$, $RuO_x$ or $WO_x$.

The gate filling material of the first gate stack preferably comprises a semiconductor, more preferably Si or SiGe.

The another gate filling material of the second gate stack may comprise TiN, TaN, TaC, TiC, Ti, Mo, Ru and W.

BRIEF DESCRIPTION OF THE DRAWINGS

All drawings and figures are intended to illustrate some aspects and embodiments of the present invention. The drawings described are only schematic and are non-limiting. In the drawings, the size of some of the elements may be exaggerated and not drawn on scale for illustrative purposes.

Exemplary embodiments are illustrated in referenced figures of the drawings. It is intended that the embodiments and figures disclosed herein be considered illustrative rather than restrictive. In the different figures, the same reference signs refer to the same or analogous elements.

DETAILED DESCRIPTION OF CERTAIN ILLUSTRATIVE EMBODIMENTS

One or more embodiments of the present invention will now be described in detail with reference to the attached figures; the invention is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention. Those skilled in the art can recognize numerous variations and modifications of this invention that are encompassed by its scope. Accordingly, the description of preferred embodiments should not be deemed to limit the scope of the present invention.

Furthermore, the terms first, second and the like in the description are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description are used for descriptive purposes and not necessarily for describing relative positions. The terms so used are interchangeable under appropriate circumstances and the embodiments of the invention described herein can operate in other orientations than described or illustrated herein. For example "underneath" and "above" an element indicates being located at opposite sides of this element.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where, herein, a specific chemical name or formula is given, the material may include non-stoichiometric variations of the stoichiometrically exact formula identified by the chemical name. Lack of numerical subscript by an element in the formula stoichiometrically signifies the number one (1). Variations in the range plus/minus 20% of the exact stoichiometric number are comprised in the chemical name or formula, for the present purposes. Where an algebraic subscript is given, then variations in the range of about plus/minus 20% are comprised relative to the value of each subscript. Such varied values do not necessarily sum to a whole number and this departure is contemplated. Such variations may occur due to either intended selection and control of the process conditions, or due to unintended process variations.

It is to be noticed that the term "comprising" should not be interpreted as being restricted to the means listed thereafter; it does not exclude other elements or processes. Thus, the scope of the expression "a device comprising means A and B" should not be limited to devices consisting only of components A and B. It means that with respect to the present description, the only relevant components of the device are A and B.

Various embodiments of the invention are referring to parameters of the semiconductor device such as threshold voltage (Vt), effective work function ($WF_{eff}$), or physical characteristics of the material(s) employed such as work function (WF), Fermi level etc. The definitions as used through this document are summarized herein below.

In the MOSFET device, the gate requires a threshold voltage (Vt) to render the channel conductive. Complementary MOS (CMOS) processes fabricate both n-channel and p-channel (respectively NMOS and PMOS) transistors. The difference of the threshold voltage Vt, i.e. the difference of the threshold voltage between the NMOS and PMOS transistor, is influenced by what is called the difference of the effective work function ($\Delta WF_{eff}$). The difference of the effective work function is the difference between the effective work function of the NMOS transistor and the effective work function of the PMOS transistor. To establish threshold voltage (Vt) values for the PMOS transistor and NMOS transistor respectively, the effective work function of the respective PMOS and NMOS gate materials (gate stacks) and their corresponding channel regions is independently established through channel processing and gate processing. In other words, both gate dielectric (comprising i.e. a host dielectric and optional different capping layers) and gate electrode (comprising at least one metal layer) determine the effective work function of the gate stack (device) ($WF_{eff}$). Moreover, the gate processing itself (i.e. the sequence of the different processes and/or the thermal treatments applied) may have an influence on the effective work function of the gate stack (device) ($WF_{eff}$).

The effective work function of a gate stack (device) ($WF_{eff}$) is a parameter that can be tuned by the choice of the gate dielectric materials, gate electrode materials and by the gate processing performed. On the contrary, the work function (WF) of the gate electrode (often referred to as metal gate electrode or metal layer electrode or metal control electrode) is an intrinsic property of the material. In general, the work function of a certain material is a measure of the energy, in electron volts (eV), required to eject an electron in the material outside of a material atom to the vacuum, if the electron were initially at the Fermi level. The work function of the gate electrode may also be referred to as as-deposited work function or the intrinsic work function of the material.

For a silicon substrate, the gate electrode of a negative channel MOSFET (or NMOS) device would have an n-type work function of approximately 4.1 eV (+/−0.4 eV), and the gate electrode of a positive channel MOSFET (or PMOS) device would have a p-type work function of approximately 5.2 eV (+/−0.4 eV).

A predetermined effective work function means the tuned effective work function which is needed for a certain type of transistor. For a silicon substrate, for a PMOS transistor the effective work function should possibly be tuned to a predetermined effective work function which is approximately 5.2 eV (+/−0.4 eV). While for a NMOS transistor the effective work function should possibly be tuned to a predetermined effective work function which is approximately 4.1 eV (+/−0.4 eV).

A high-k dielectric is a dielectric featuring a dielectric constant (k) higher than the dielectric constant of SiO2, i.e. k>3.9. High-k dielectrics allow for a larger physical thickness (compared to SiO2) for obtaining a same effective capacitance than can be obtained with a much thinner SiO2 layer.

In the following certain embodiments will be described with reference to a silicon (Si) substrate but it should be understood that they apply equally well to other semiconductor substrates. In embodiments, the "substrate" may include a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on-sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer.

A semiconductor device comprises at least one semiconductor transistor. A MOSFET semiconductor device comprises at least one metal-oxide-semiconductor field effect transistor. A CMOS semiconductor device comprises at least a PMOS transistor and at least an NMOS transistor. A dual work function semiconductor device comprises at least a first transistor having a first effective work function and at least a second transistor having a second effective work function being different from the first effective work function. More specifically an dual work function CMOS device comprises at least a first NMOS transistor having a first effective work function and at least a second PMOS transistor having a second effective work function being different from the first effective work function.

A first aspect of the present invention relates to a method for manufacturing a dual work function semiconductor device.

Various embodiments of the present invention relate to a method for manufacturing a dual work function semiconductor device, the method comprising:
  providing a semiconductor substrate;
  providing a gate dielectric layer on and in contact with the semiconductor substrate;
  forming a metal layer on and in contact with the gate dielectric layer; forming a layer of gate filling material on and in contact with the metal layer; patterning the gate dielectric layer, the metal layer and the gate filling layer to form a first gate stack and a second gate stack;
  forming in the semiconductor substrate source and drain regions for both the first gate stack and the second gate stack;
  forming a dielectric layer in the first and the second region at least aside of the first and the second gate stack;
  thereafter removing the gate filling material only from the second gate stack thereby exposing the underlying metal layer;
  converting the exposed metal layer into an metal oxide layer;
  reforming the second gate stack with another gate filling material.

A second aspect of the present invention relates to a dual work function semiconductor device.

Various embodiments of the present invention relate a dual work function semiconductor device comprising a semiconductor substrate; a first gate stack and a second gate stack on the semiconductor substrate. The first gate stack comprises a first gate dielectric layer on and in contact with the semiconductor substrate; a metal layer on and in contact with the first gate dielectric layer; a gate filling material on and in contact with the metal layer. The second gate stack comprises a second gate dielectric layer on and in contact with the semiconductor substrate, the second gate dielectric layer consisting of the same material as the first gate dielectric layer; a metal oxide layer on and in contact with the first gate dielectric layer; the metal oxide layer comprising a metal oxide formed by converting a metal into the metal oxide, the metal being the same as the metal from the metal layer in the first gate stack; another gate filling material on and in contact with the metal oxide layer, the another gate filling material comprising another material than the gate filling material from the first gate stack.

With reference now to FIG. 1 to FIG. 11 different process steps for different embodiments of a method of manufacturing a dual work function semiconductor device according to the first aspect of the present invention is described in more detail.

Figure 1:
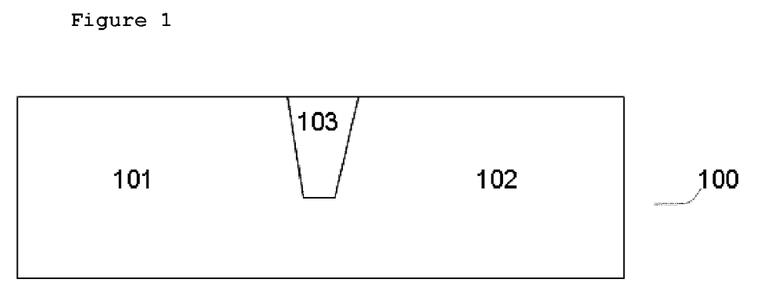
FIG. 1 to 9 give a schematic representation of different process steps for manufacturing a dual work function semiconductor device as described in certain embodiments of the invention.

FIG. 1 illustrates a semiconductor substrate 100, e.g. a silicon substrate. The substrate 100 may comprise multiple distinct regions. Most preferably two distinct regions may be defined in the substrate 100, as is illustrated in FIG. 1: a first region 101 and a second region 102. The first region 101 may also be referred as the first active region of the device and the second region 102 may also be referred as the second active region of the device. The first region 101 and the second region 102 are preferably electrically isolated from each other by an insulating region 103. A possible way to isolate the first 101 and second 102 region from each other is by using shallow trench isolation (STI) in between. STI is a deep narrow trench, filled with oxide, etched into the semiconductor substrate in between adjacent devices in an integrated circuit to provide electrical isolation between. Alternatively, local oxidation of silicon (LOCOS) may be used.

A first gate stack will be formed in the first region 101, the first gate stack being for example part of a NMOS transistor (and thus the first region 101 representing a NMOS region for forming a NMOS transistor). A second gate stack will be formed in the second region 102, the second gate stack being for example part of a PMOS transistor (and thus the second region 102 representing a PMOS region for forming a PMOS transistor). It should be understood that the invention is not limited thereto and NMOS and PMOS may be interchanged, i.e. forming a first PMOS transistor in the first (PMOS) region and a second NMOS transistor in the second (NMOS) region.

After providing the first region 101 and the second region 102 a stack of layers 107 is provided on the semiconductor substrate 100.

Figure 2:
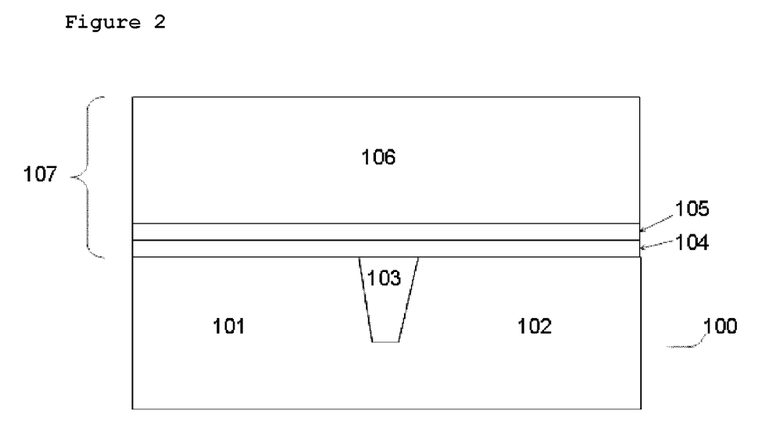

First a gate dielectric layer 104 is provided on the substrate (FIG. 2). The gate dielectric layer 104 is provided in both the first region 101 and second region 102. The gate dielectric layer 104 may be a layer of insulating material, such as for example silicon dioxide ($SiO_2$), silicon nitride (SiN) or silicon oxynitride ($Si_xO_yN_{1-x-y}$) or more preferably any high-k dielectric material (i.e. k>3.9) such as for example $HfO_x$, $LaO_x$, $TaO_x$, $AlO_x$, or any combination made thereof. The gate dielectric layer 104 may be formed by thermal oxidation, atomic layer deposition (ALD) or chemical vapor deposition (CVD) or physical vapor deposition (PVD), or any other suitable method known to a person skilled in the art. The gate dielectric layer 104 may comprise a stack of dielectric materials, such as for example a dielectric capping layer formed on top of a high-k material (e.g. $HfO_2$) formed on top of an (optional) interfacial dielectric layer (e.g. $SiO_2$—not shown) between the substrate 100 and high-k material. The gate dielectric layer 104 has a thickness preferably in the range of 0.5 nm to 4 nm, leading to an EOT (equivalent oxide thickness) preferably below 2 nm.

After providing the gate dielectric layer 104 a metal layer 105 is provided on and in contact with the gate dielectric layer 104 (FIG. 2). The effective work function of the first and the second gate stack will be mainly determined by the metal layer 105. Parameters of the metal layer 105 of interest for tuning the effective work function of the first and/or second gate stack are at least the choice of metal of the metal layer 105, the thickness of the metal layer 105.

Materials of interest for the metal layer 105 are any oxygen deficient midgap metal such as for example TiN, TaN, TaC, TiC, Ti, Mo and W. With oxygen deficient is meant lacking oxygen, thus a metal containing limited amount to no oxygen atoms. Preferably the metal should comprise an oxygen concentration below 20 percent mole composition, more preferably below 10 percent mole composition.

After providing the metal layer 105 a gate filling material 106 is formed on and in contact with the metal layer 105 (FIG. 2). With gate filling material is meant that the gate filling material serves mainly for further filling up the gate stack. The gate filling material may comprise any material suitable for filling up the gate stack to a predefined height. In furthers steps according to embodiments of the present invention the gate filling material may be removed. The thickness of the gate filling layer 106 is typically larger than the thickness of the metal layer 105, since the gate filling layer is for further filling up the gate stack. The thickness of the gate filling layer 106 is preferably in the range of 50 nm to 200 nm, more preferably in the range of 50 nm to 150 nm. The thickness of the gate filling layer 106 is at least 25 times larger than the thickness of the metal layer 105 (for example a 4 nm metal layer with a 100 nm gate filling layer). More preferably the thickness of the gate layer 106 is at least 50 times larger than the thickness of the metal layer 105 (for example a 2 nm metal layer with a 150 nm gate filling layer). The gate filling material may (but not necessarily) comprise a work function tuning material. The gate filling material may also be a semiconductor material such as for example Si or SiGe. For example a 100 nm poly-Si layer may be formed on top of a 2 nm TiN layer. Alternatively the gate filling material may be a metal such as for example W. The gate filling material may be formed with any gate deposition technique well known for a person skilled in the art such as CVD, PVD, ALD or MOCVD.

An example for the metal layer 105 is a TiN layer. If the TiN layer is capped with N-type Si, which serves as the gate filling layer 106, depending on the thickness of the TiN layer the effective work function may be tuned to a low work function or a midgap work function. For a thin TiN layer, i.e. a thickness in between 0.5 nm to 5 nm, the effective work function can be tuned to an effective work function suitable for a NMOS transistor (i.e. approximately 4.1 eV (+/−0.4 eV)). For a thicker TiN layer, i.e. a thickness above 5 nm, the effective work function can be tuned to a midgap work function (i.e. approximately 4.7 eV (+/−0.3 eV)). A TiN layer is not a suitable metal layer for a PMOS transistor since the thickness cannot be adapted to achieve the high work function needed for a PMOS transistor (i.e. approximately 5.2 eV (+/−0.4 eV)). If the same metal is to be used for the PMOS transistor, an additional process step is necessary in order to achieve the high effective work function needed.

Depending on the choice of material for the gate filling layer 106 the effective work function of the gate stack may be further tuned to a lower or higher work function value.

Figure 3:
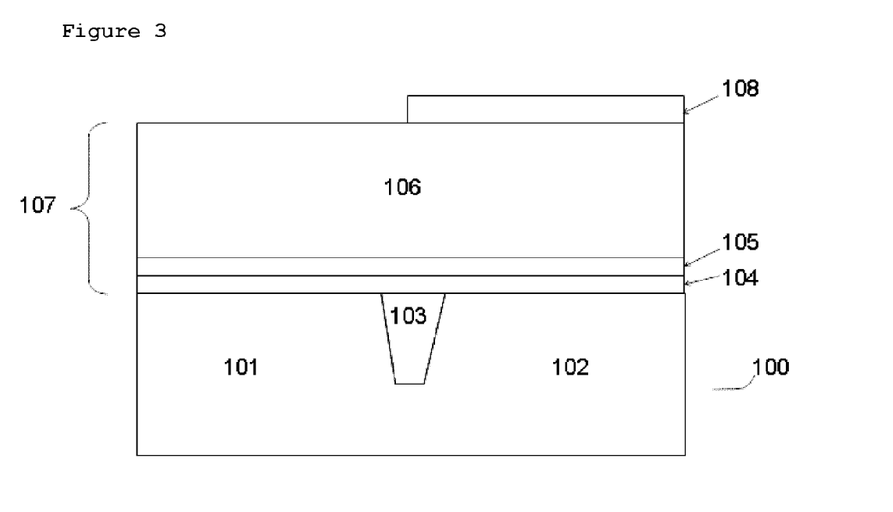

According to a certain embodiment of the present invention a protective layer 108 may be formed on and in contact with the gate filling layer 106 in the second region 102 (FIG. 3).

Figure 4:
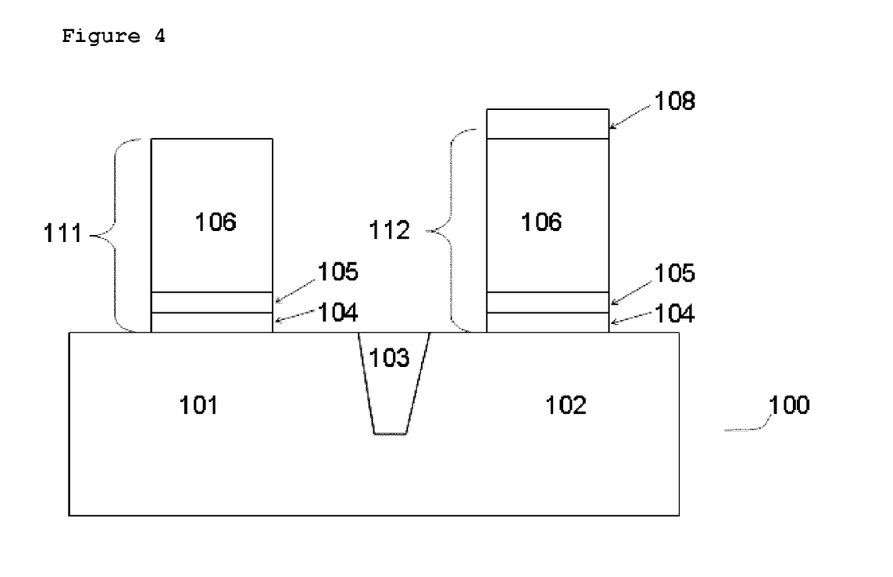

After providing the stack of layers 107 for the gate stack formation, the first 111 and second 112 gate stack may be formed. By conventional lithographic processes and etch processes known for a person skilled in the art a first and second gate stack may be patterned (FIG. 4).

Before forming a first 111 and a second 112 gate stack a protective layer 108 may be formed on top of the gate filling layer 106 in the second region 102 (FIG. 3). The protective layer 108 may for example be a SiN layer or a hardmask. This protective layer 108 will protect the second gate stack 112 during further processing steps, more specifically during a following silicidation process, such that the gate filling material of the second gate stack is not silicided. This protective layer should be sufficiently thick, i.e. preferably between 20 nm to 300 nm. This is required during further processing steps, as will be explained later.

The first gate stack and the second gate stack are formed by patterning the protective layer 108, the gate filling layer 106, the metal layer 105 and the gate dielectric layer 104 using conventional lithographic processes and etch processes known for a person skilled in the art.

Figure 5:
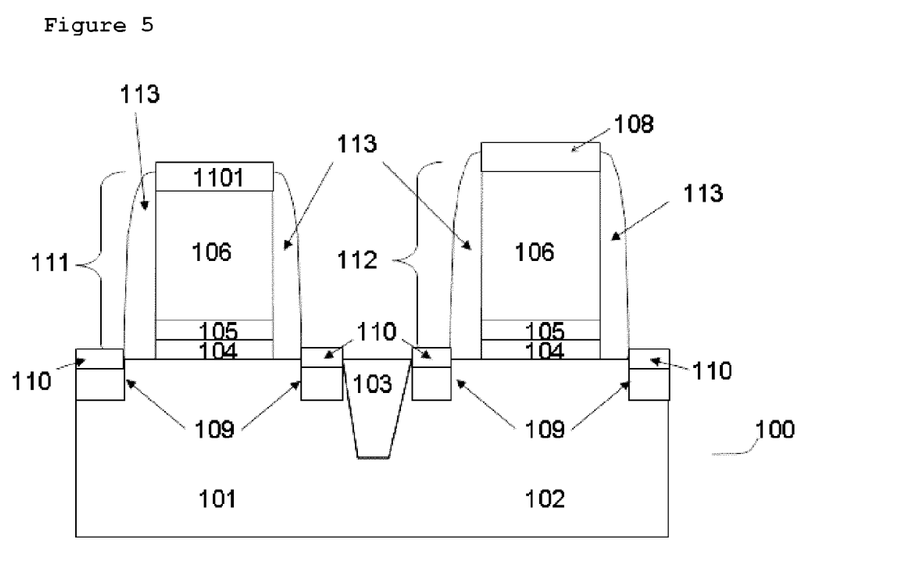

After patterning the stack of layers 107 and protective layer 108 as such forming the first 111 and the second 112 gate stack, spacers 113 are provided. Following the conventional dopants implantation processes, an activation process of the source/drain regions 109 (extension regions/junction regions) and an additional silicidation process in the first region 101 and in the second region 102 are performed thus forming silicide regions 110 (FIG. 5). During the silicidation process also part of the gate filing material 106 of the first gate stack 111 is silicided (thus forming a first gate silicide region 1101). Due to the protective layer 108 on top of the second gate stack 112 the gate filling material 106 of the second gate stack is not silicided during this silicidation process. The protective layer 108 is protecting the top of gate filling material 106 of the second gate stack from being modified into a silicided material.

The spacers 113 preferably comprise an insulating material such as for example silicon dioxide (SiO$_2$), silicon nitride (SiN) or silicon oxynitride (SiON). Spacers may be deposited by ALD or CVD and patterned by anisotropic etching, or any other suitable method known to a person skilled in the art.

For the activation of the source/drain regions an annealing process is necessary. This annealing process comprises a high temperature process. This is a high thermal budget process. The temperature of the annealing process is typically higher than 500 degrees Celsius, preferably higher than 800 degrees Celsius, more preferably in the range of 800 degrees Celsius to 1400 degrees Celsius. Spike annealing or rapid thermal annealing (RTA) or laser annealing may be used.

Figure 6:
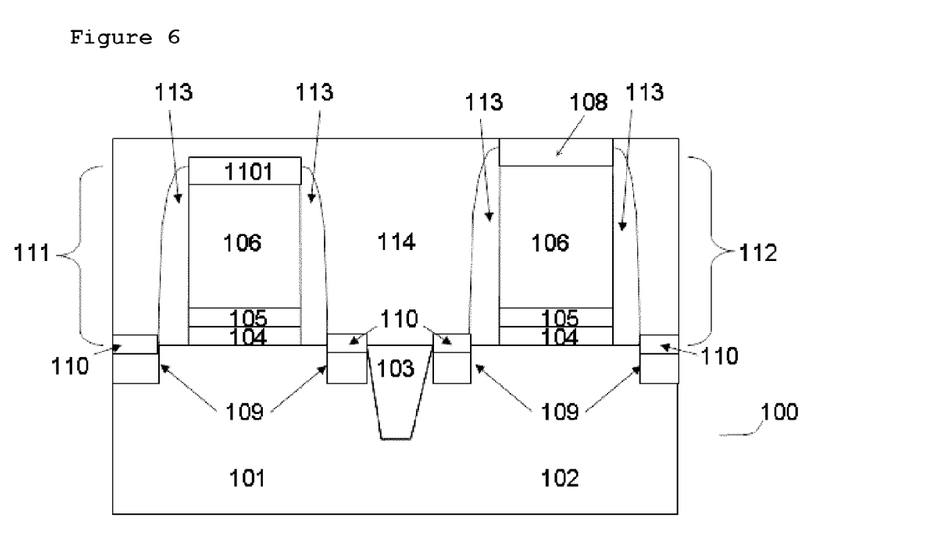

In a next process a dielectric layer 114 is formed in the first 101 and the second 102 region at least next to the first 111 and the second 112 gate stack (FIG. 6). The dielectric material 114 is thus located adjacent to the first 111 and the second 112 gate stack. The dielectric layer is in contact with the sides of the first 111 and the second 112 gate stack. The first 111 and the second 112 gate stack may already comprise spacers. If spacers are available, the dielectric layer 114 is in contact with and next to the. The dielectric layer 114 may also be present on top of the first gate stack 111, more specifically on top of the gate silicide region 1101 of the first gate stack 111. The formation of the dielectric layer 114 may be done for example by depositing the dielectric layer 114 using CVD, followed by polishing back (e.g. using CMP) or etching back the dielectric layer 114 to expose the protective layer 108 in the second region 102. Since the height of the protective layer 108 is sufficiently thick, it will be first exposed during the polishing back (e.g. using CMP) or etching back the dielectric layer 114 process. Otherwise the the thickness of the protective layer 108 is chosen such that during the formation of the dielectric layer 114 more specifically during polishing back the dielectric layer 114, the protective layer 108 is exposed whereas the silicide region 1101 in the first gate stack remains covered by the dielectric layer 114. The dielectric layer 114 forms another protective layer for protecting the underlying source/drain regions 109 and silicide regions 110, 1101 and spacers 113 during a subsequent etching process for removing the gate filling material 106 of the second gate stack 112. The dielectric layer 114 may comprise for example a low-k dielectric or SiO$_2$.

The dielectric layer 114 may be polished back until the gate silicide region 1101 is exposed. However this is not desirable, since during a next oxidation process, the gate silicide region 1101 will be subjected to the oxidation and will thus partly be oxidized. Advantageously the gate silicide region 1101 is covered by the dielectric layer 114.

Figure 7:
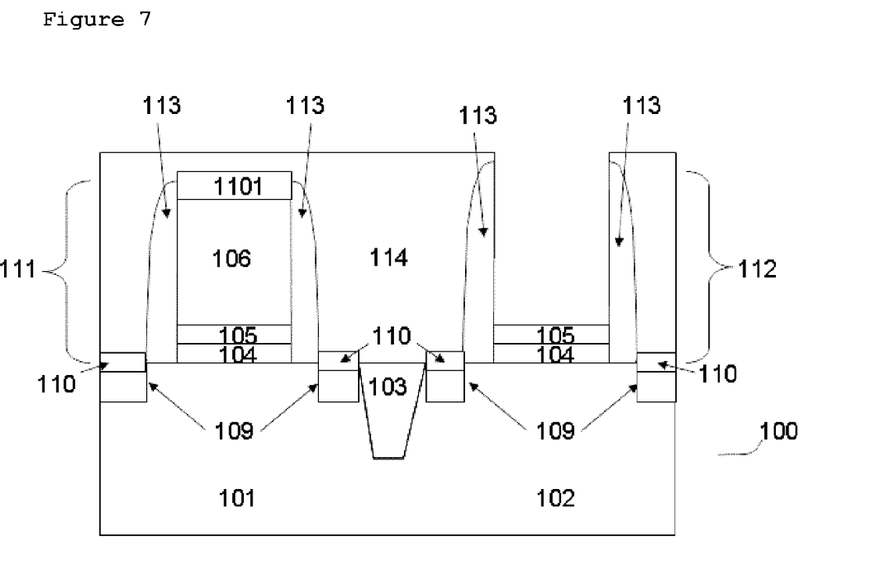

In a next process a removal of the protective layer 108 and the gate filling layer 106 of the second gate stack 112 in the second region 102 is performed (FIG. 7). The removal process may be done using at least one etching process which does not affect the dielectric layer 114 and the spacers 113. The removal process should be selective towards the metal layer 105. If for example SiN is chosen as the protective layer 108, it may be removed with for example a $H_3PO_4$ based wet etching process (selective towards the dielectric layer 114, for example $SiO_2$). If for example the gate filling layer 106 comprises Si and the metal layer 105 comprises TiN, this Si gate filling layer may be removed without significantly attacking the TiN layer underneath by a $NH_4OH$ based wet etch process. After removing the protective layer 108 and the gate filling layer 106 of the second gate stack 112 the metal layer 105 is exposed.

Figure 8:
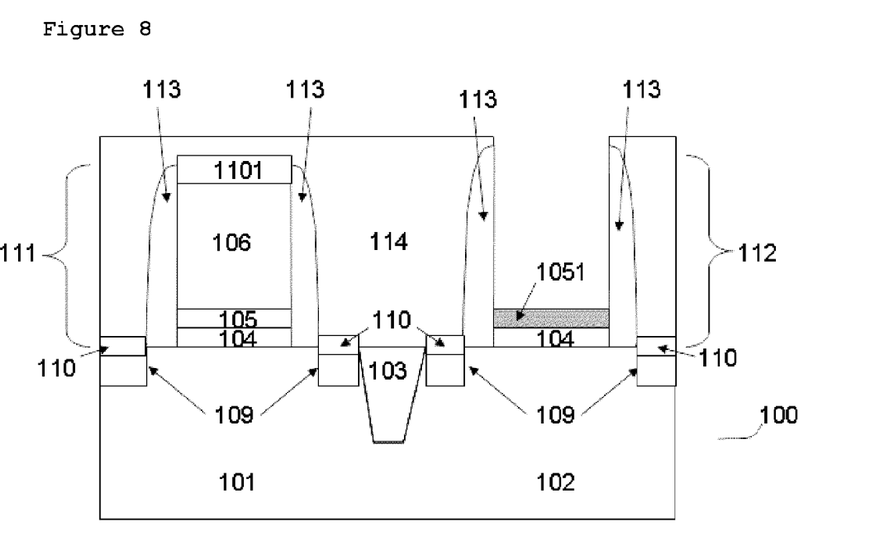

After removing the protective layer 108 and the gate filling layer 106 the exposed metal layer 105 is converted and thus modified into an metal oxide layer 1051 (FIG. 8). Converting the exposed metal layer 105 into a metal oxide layer 1051 may be done using different techniques. The converting process is performed locally, i.e. only affecting the exposed metal layer 105 of the second gate stack and not affecting the first gate stack. The dielectric layer 114 protects the other layers and materials (source/drain 109 and silicide regions 110, 1101, spacers 113, the first gate stack 111) from being modified during the process of converting the metal layer 105 into a metal oxide layer 1051.

After the converting process, the metal layer 105 from the first gate stack remains unchanged while the metal layer 105 from the second gate stack is changed into a metal oxide layer 1051. The first gate stack and thus also the effective work function of the first gate stack and thus also the EOT of the first gate stack is not affected by this converting process.

According to certain embodiments of the present invention, the converting process may be an oxidation process. The metal oxide layer 1051 is thus an oxidized metal layer. The oxidation process is performed using an annealing process or by implantation of oxygen into the metal layer 105. The temperature of the annealing is preferably between 20 degrees Celsius to 500 degrees Celsius, more preferably between 200 degrees Celsius to 400 degrees Celsius. The annealing time is preferably above 1 second, more preferably between 10 seconds to 1200 seconds. The implantation of oxygen is preferably to be performed with plasma implantation to reduce the penetration of the oxygen species through the thin oxidized metal 1051 layer. The metal layer 105 must be completely oxidized, otherwise the, the metal layer 105 must be completely converted into an oxidized metal layer 1051. The thickness of the metal layer 105 should thus be chosen such that not only the surface of the metal layer 105 is oxidized but also the bulk of the metal layer 105 is oxidized. In this way, the effective work function of the second gate stack can be modified effectively. The material of the metal layer 105 must be chosen such that the effective work function of the second gate stack is tuned towards an effective work function suitable for the second gate stack after the oxidation process. The second region may for example be a PMOS region. By choosing for example TiN as metal layer 105, the effective work function of the second (PMOS) region may be tuned towards a suitable effective work function of approximately 5.2 eV ((+/−0.4 eV)) by oxidizing the TiN layer and thus converting the TiN layer into a $TiO_xN_y$ layer.

Next the second gate stack is reformed using another gate filling material. The another gate filling material is formed on top of the metal oxide layer 1051. With reformed is meant that at least another gate filling material is formed on top of the metal oxide layer until the final height of the second gate stack is achieved. When using a dielectric layer 114, the opening of the second gate stack 112, which was created by removing the protective layer 108 and gate filling material 106 is thus refilled with another gate filling material 115 (FIG. 9) followed by polishing back (e.g. using CMP) or etching back the filling material 115 to expose the dielectric layer 114 and the gate silicide region 1101. The another gate filling material may be any metal such as for example TiN, TaN, TaC, TiC, Ti, Mo, Ru and W.

Figure 9:
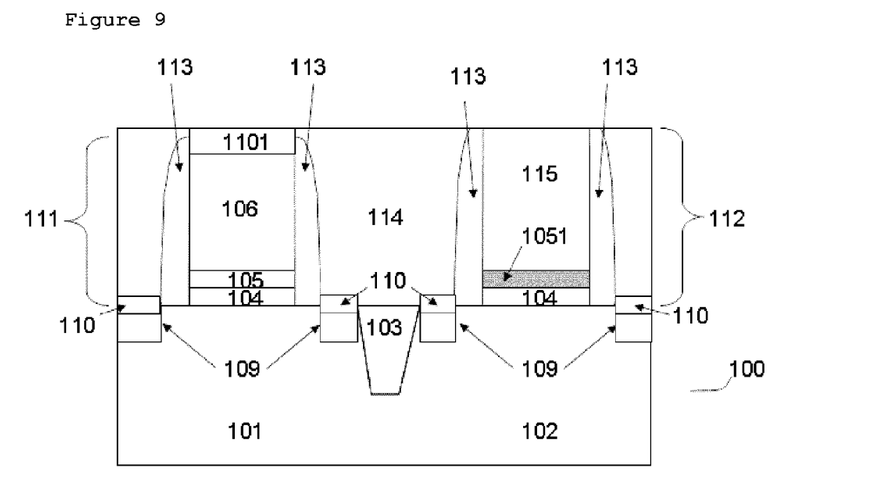
Figure 10:
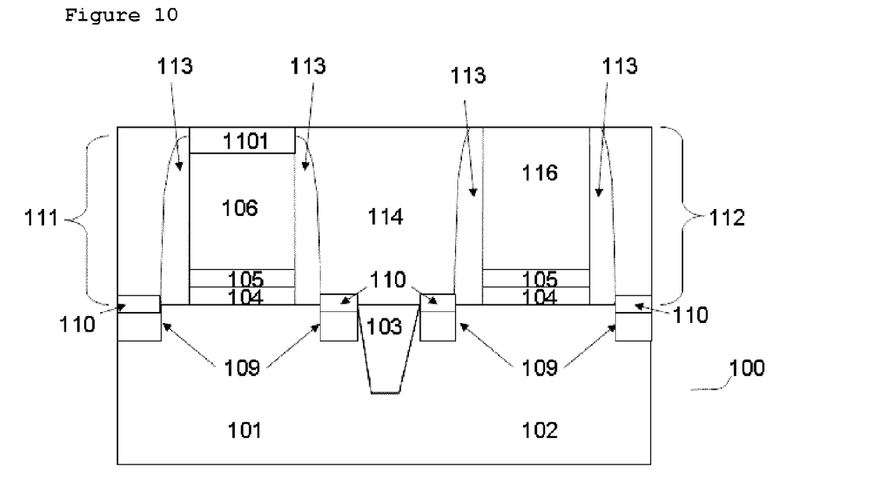
FIG. 10 to 11 give a schematic representation of different process steps for manufacturing a dual work function semiconductor device as described in certain embodiments of the invention.

In the first region a first transistor is thus formed comprising a metal layer 105 and the first filling material 106 and thereby having predetermined effective work function, in the second region a second transistor is thus formed comprising the oxidized metal layer 1051 and the second filling material 115 and thereby having another predetermined work function. Starting from the same metal layer a dual work function semiconductor device may be manufactured.

Figure 11:
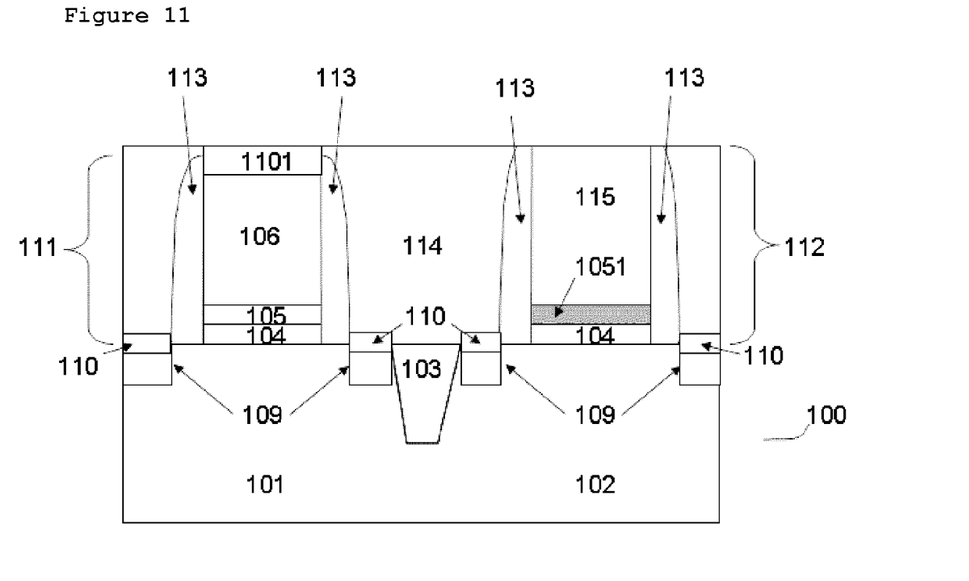

According to another embodiment (FIG. 10), the second gate stack 112 is first reformed using another gate filling material 116 after removing the protective layer 108 and the gate filling material 106 but before the process of converting the metal layer 105 into a metal oxide 1051. In case a dielectric layer 114 is used, the second gate stack is refilled with the another gate filling material 116 after removing the protective layer 108 and the gate filling material 106 but before the process of converting the metal layer 105 into a metal oxide layer 1051. In such a case, an oxide-rich metal may be used as the another gate filling material 116 such as for example $RuO_x$, $MoO_x$, $WO_x$. Next, after providing the another gate filling material 116, a thermal treatment may be performed such that the oxide-rich gate filing material 116 may supply oxygen to the underlying metal layer 105 and as such convert the metal layer 105 into an metal oxide 1051 (FIG. 11). The intensity of the thermal treatment should not be too high to cause oxygen penetration through the dielectric layer 105 or other side effects significantly. The temperature of the thermal treatment is preferably between 200 degrees Celsius to 600 degrees Celsius, more preferably, between 300 degrees Celsius to 450 degrees Celsius and the preferred time is between 1 second to 60 minutes, more preferably between 1 minute to 20 minutes. This thermal treatment can also be regarded as being implemented during the following steps of processing, for example during the passivation of the gate dielectric or during the deposition of the dielectric layer necessary for the backend interconnections.

In the first region a first transistor is thus formed comprising a metal layer 105 and the first filling material 106 and thereby having predetermined effective work function, in the second region a second transistor is thus formed comprising the metal oxide layer 1051 and the second filling material 116 and thereby having another predetermined work function. Starting from the same metal layer a dual work function semiconductor device may be manufactured.

Since no further high temperature thermal treatments are performed after the converting process of the metal layer (by oxidation of the metal layer or by supplying oxygen to the metal layer via the another gate filling material), the effective work function will not change significantly nor will the EOT increase significantly during further process steps in the integration flow. The effective work function change is preferably within ±0.2 eV, even more preferably within ±0.1 eV and the EOT change is preferably within ±0.2 nm, even more preferably ±0.1 nm.

It is an advantage of certain embodiments that a large effective work function difference may be achieved between a first (NMOS) and a second (PMOS) transistor starting from the same metal layer and same gate dielectric layer for both transistors. The integration scheme for manufacturing a dual work function CMOS device according to embodiments of the present invention is a single metal single dielectric integration scheme. This means both transistors comprise the same metal layer and same gate dielectric material at the first process of the integration flow (FIG. 1) but have different effective work function at the end of the integration flow, i.e. after converting the metal layer into a metal oxide layer (FIG. 11). The difference of the effective work function is achieved by modifying the metal layer for one of the two transistors without affecting the metal layer of the other one of the two transistors.

It is an advantage of certain embodiments that a large effective work function difference may be achieved between a first (NMOS) and a second (PMOS) transistor starting from the same metal layer for both transistors without affecting the effective oxide thickness (EOT) of the gate dielectric layer significantly. Especially for low EOT this is very favourable, which is used for example in highly scaled CMOS, finfet technology and SOI devices. Also for low power devices or DRAM devices the method for manufacturing a dual work function device according to embodiments of the present invention is very attractive.

The effective work function difference between NMOS and PMOS transistor could even be increased by adding other work function tuning elements into the first and the second gate stack as known for a person skilled in the art. For example an AlO capping layer may be used in between the gate dielectric layer and the oxidized metal layer to further increase the effective work function of the PMOS transistor towards values of approximately 5.0 eV. For example by adding As I/I one can further lower the effective work function of the NMOS transistor towards values of approximately 4.1 eV.

It is an advantage of certain embodiments that an integration friendly process flow is used for manufacturing a dual work function semiconductor device.

It is an advantage of certain embodiments that the gate dielectric 114 is not exposed to any etching process since it is always protected by the metal layer on top of it. This is especially important to keep the properties of the gate dielectric unchanged and achieve high reliability.

Figure 12:
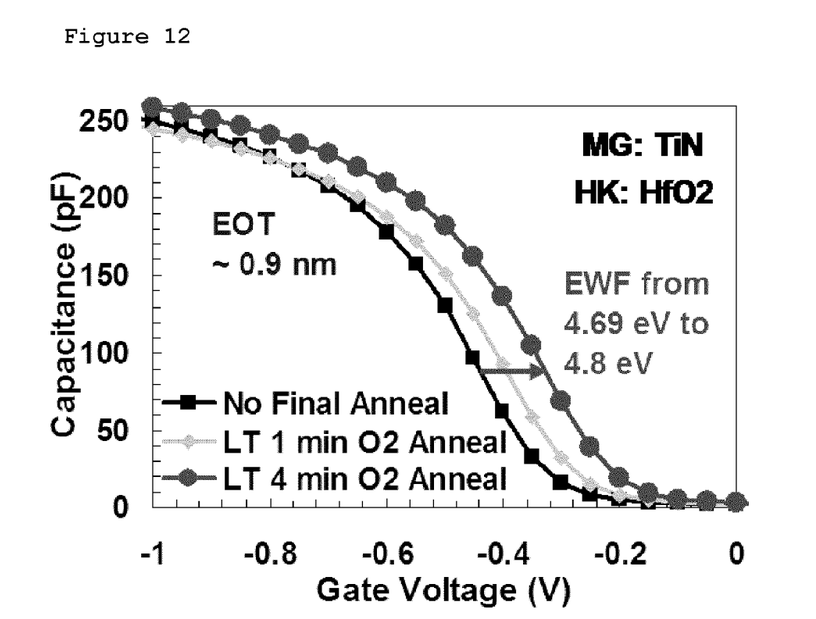
FIG. 12 represents experimental data (C-V curve) for a PMOS transistor of a dual work function semiconductor device manufactured with the method as described in certain embodiments of the invention.

In FIG. 12 experimental data are shown for a PMOS transistor according to embodiments. C-V curves are shown for a gate stack comprising a TiN metal layer according to embodiments of the present invention. First a dielectric layer is formed on top of the Si substrate, more specifically a 1 nm $SiO_2$/2.5 nm $HfO_2$ layer. Next a metal layer, more specifically a 2 nm TiN layer is formed on top of the gate dielectric layer. Next a poly-Si gate filling material was formed on top of the TiN layer. After junction activation anneal and silicidation, the poly-Si gate filling material is selectively removed with ammonia. The TiN layer is thus exposed after the removal process. Next an $O_2$ anneal was performed at 300 degrees Celsius for 1 (diamonds) to 4 (dots) minutes (a reference without (squares) this anneal is also shown). The TiN layer is thus converted into a TiON layer after the oxidation process. The gate stack was refilled with a gate filling material, in this example a 50 nm TiN capping layer. A 420 degrees Celsius forming gas anneal was performed for 20 minutes to passivate the dielectrics, a commonly known process for a person skilled in the art with the purpose of achieving low defect density in the gate dielectric. From the electric measurements on a capacitor device formed with this gate stack, i.e. the C-V curves, it is seen that the effective work function for the PMOS transistor has increased from 4.69 eV (squares) towards 4.8 eV (circles) after the $O_2$ anneal. No significant increase of the gate dielectric thickness, more specifically of the EOT (equivalent oxide thickness) was found.

Figure 14:
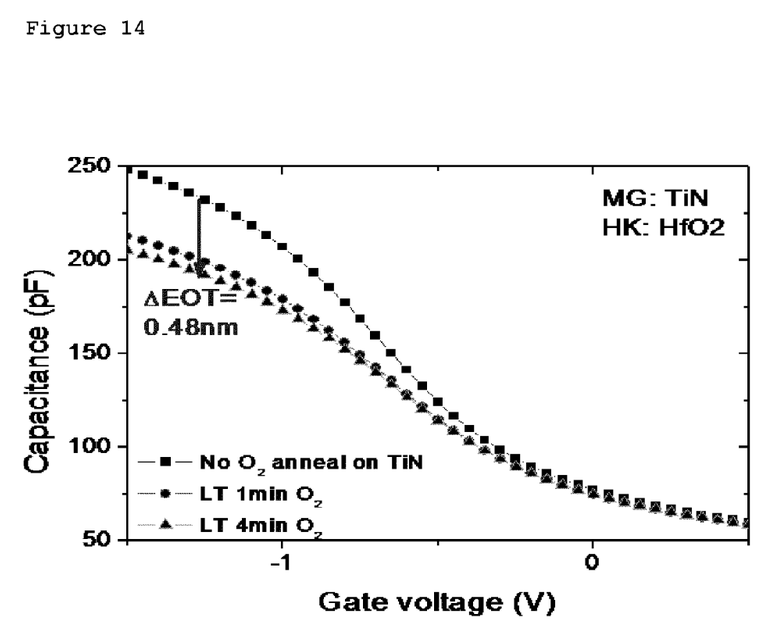
FIG. 14 represents experimental data (C-V curves) for a PMOS transistor of a dual work function semiconductor device.

In FIG. 14 experimental data (C-V curves) are shown for an analogous PMOS transistor gate stack as in FIG. 12. However for FIG. 14 the $O_2$ anneal was performed before the junction activation process. More precisely first a dielectric layer is formed on top of the Si substrate, more specifically a 1 nm $SiO_2$/2.5 nm $HfO_2$ layer. Next a metal layer, more specifically a 2 nm TiN layer is formed on top of the gate dielectric layer. Immediately after the 2 nm TiN deposition an $O_2$ anneal was performed at 300 degrees Celsius for 1 (dots) to 4 (rectangles) minutes (a reference without (squares) this anneal is also shown). Next a 100 nm poly-Si gate filling material was formed by using CVD on top of the TiN layer. Thereafter, according to prior art, a high temperature junction activation anneal is performed. It is found that the EOT (equivalent oxide thickness) is increased by 0.48 nm. The effective work function of the gate stack is not significantly impacted. This increase in EOT is however not desired and is due to the junction activation process which is performed after the oxygen anneal of the metal TiN layer.

Figure 13:
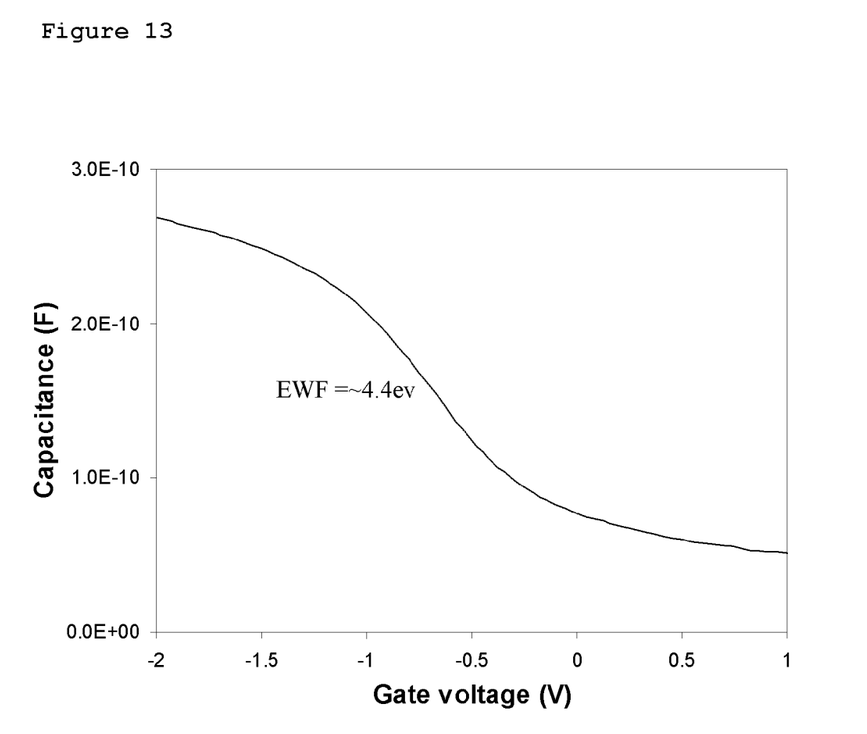
FIG. 13 represents experimental data (C-V curve) for a NMOS transistor of a dual work function semiconductor device manufactured with the method as described in certain embodiments of the invention.

In FIG. 13 experimental data are shown for an NMOS transistor according to embodiments of the present invention. A C-V curve is shown for a gate stack comprising a TiN metal layer according to embodiments of the present invention. First a dielectric layer is formed on top of the Si substrate, more specifically a 1 nm $SiO_2$/2.5 nm $HfO_2$ layer. Next a metal layer, more specifically a 2 nm TiN layer is formed on top of the gate dielectric layer. Next a poly-Si gate filling material was formed on top of the TiN layer. From the electric measurements on a capacitor device formed with this gate stack, i.e. the C-V curves, it is seen that the effective work function for the NMOS transistor is approximately 4.4 eV, which is in the range of the desired work function of approximately 4.1 eV (+/−0.4 eV) for an NMOS transistor.

In a second aspect of the present invention a dual work function semiconductor device is disclosed. The dual work function semiconductor device comprises a semiconductor substrate; a first gate stack and a second gate stack on the semiconductor substrate. The first gate stack comprises a first gate dielectric layer on and in contact with the semiconductor substrate; a metal layer on and in contact with the first gate dielectric layer; a gate filling material on and in contact with the metal layer. The second gate stack comprises a second gate dielectric layer on and in contact with the semiconductor substrate, the second gate dielectric layer consisting of the same material as the first gate dielectric layer; a metal oxide layer on and in contact with the first gate dielectric layer; another gate filling material on and in contact with the metal oxide layer, the another gate filling material comprising another material than the gate filling material from the first gate stack. The metal oxide layer comprises a metal oxide formed by converting a metal into the metal oxide, the metal being the same as the metal from the metal layer in the first gate stack. The metal layer of the first gate stack is for example M. The metal oxide layer of the second gate stack will then be $M_xO_y$. The gate filling material of the first gate stack comprises preferably Si or SiGe. The metal layer of the first gate stack comprises preferably a midgap oxygen-deficient metal, such as for example TiN, TaN, TaC, TiC, Ti, Mo, Ru or W. The metal oxide layer respectively comprises $TiO_xN_y$, $TaO_xN_y$, $TaO_xC_y$, $TiO_xC_y$, $TiO_x$, $MoO_x$, $RuO_x$ or $WO_x$. The another gate filling material of the second gate stack may comprise a metal, such as TiN, TaN, TaC, TiC, Ti, Mo, Ru or W. This metal may be an oxygen-rich metal such as $RuO_x$, $MoO_x$ or $WO_x$.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A method of manufacturing a dual work function semiconductor device, the method comprising:
   providing a semiconductor substrate;
   providing a gate dielectric layer on and in contact with the semiconductor substrate;
   forming a metal layer having a thickness on and in contact with the gate dielectric layer,
   forming a first gate filling material on and in contact with the metal layer;
   patterning the gate dielectric layer, the metal layer and the first gate filling material to form a first gate stack and a second gate stack;
   after patterning, introducing dopants into substrate regions adjacent the first and second gate stacks and annealing to activate the dopants, thereby forming activated source/drain regions for both first and second gate stacks;
   after annealing, selectively removing the first gate filling material only from the second gate stack thereby exposing the underlying metal layer;
   after selectively removing, replacing the first gate filling material removed from the second gate stack with a second gate filling material formed of an oxygen-rich metal to form a replacement gate stack comprising the second gate filling material formed on the underlying metal layer; and
   thermally treating to supply oxygen atoms from the second gate filling material to the underlying metal layer to convert the underlying metal layer of the replacement gate stack into a metal oxide layer.

2. The method according to claim 1, wherein the thickness of the metal layer is selected to achieve an effective work function selected for the first gate stack and another effective work function selected for the second gate stack after converting the exposed metal layer.

3. The method according to claim 1, wherein the thickness of the metal layer is in the range between about 0.5 nanometers and 5 nanometers.

4. The method according to claim 1, wherein the metal layer comprises an oxygen-deficient metal having an oxygen concentration not exceeding 20 percent by mole fraction.

5. The method according to claim 4, wherein the first gate filling material is chosen such that the effective work function of the first gate stack is tuned to have a value suitable for an NMOS transistor within 4.1 eV+/−0.4 eV that is lower than the work function of the metal layer.

6. The method according to claim 5, wherein thermally treating forms the metal oxide such that the effective work function of the replacement gate stack is tuned to have a value suitable for a PMOS transistor within 5.2 eV+/−0.4 eV that is higher than the work function of the metal layer.

7. The method according to claim 6, wherein the metal layer is formed of a material selected from the group consisting of TiN, TaN, TaC, TiC, Ti, Mo and W.

8. The method according to claim 7, wherein the metal layer is formed of TiN.

9. The method of claim 7, wherein the first gate filling material is Si or SiGe.

10. The method of claim 9, wherein the first gate filling material is Si.

11. The method of claim 9, wherein the oxygen-rich metal is selected from the group consisting of an oxygen-rich Mo, an oxygen-rich Ru and an oxygen rich W.

* * * * *